United States Patent [19]
Thurnhofer et al.

[11] Patent Number: 5,935,266
[45] Date of Patent: Aug. 10, 1999

[54] METHOD FOR POWERING-UP A MICROPROCESSOR UNDER DEBUGGER CONTROL

[75] Inventors: Stefan Thurnhofer, Emmaus; Shaun P. Whalen, Wescosville, both of Pa.

[73] Assignee: Lucent Technologies Inc., Murray Hill, N.J.

[21] Appl. No.: 08/746,727

[22] Filed: Nov. 15, 1996

[51] Int. Cl.⁶ .................................................. G01R 31/28
[52] U.S. Cl. ............................................ 714/726; 714/30
[58] Field of Search .................................. 371/22.3, 22.1, 371/22.5; 395/183.06, 183.12, 183.15, 800; 364/579, 550; 324/512; 714/726, 23, 25, 27, 30, 36, 39, 47, 727, 733

[56] References Cited

U.S. PATENT DOCUMENTS

| | | | |
|---|---|---|---|
| 5,222,068 | 6/1993 | Burchard | 371/22.3 |
| 5,329,471 | 7/1994 | Swoboda et al. | 364/578 |
| 5,404,526 | 4/1995 | Dosch et al. | 371/22.1 |
| 5,428,624 | 6/1995 | Blair et al. | 371/22.3 |
| 5,434,804 | 7/1995 | Bock et al. | 364/579 |
| 5,448,576 | 9/1995 | Russell | 371/22.3 |
| 5,459,737 | 10/1995 | Andrews | 371/22.5 |
| 5,479,652 | 12/1995 | Dreyer et al. | 395/183.06 |
| 5,509,019 | 4/1996 | Yamamura | 371/21.1 |
| 5,519,715 | 5/1996 | Hao et al. | 371/22.3 |
| 5,526,365 | 6/1996 | Whetsel | 371/22.3 |
| 5,561,614 | 10/1996 | Revilla et al. | 364/579 |
| 5,561,761 | 10/1996 | Hicok et al. | 395/183.06 |
| 5,590,354 | 12/1996 | Klapproth et al. | 395/800 |
| 5,623,687 | 4/1997 | Yishay et al. | 395/800 |
| 5,631,912 | 5/1997 | Mote, Jr. | 371/22.3 |
| 5,644,580 | 7/1997 | Champlin | 371/22.5 |
| 5,768,152 | 6/1998 | Battaline et al. | 364/551.01 |

*Primary Examiner*—Joseph E. Palys
*Assistant Examiner*—Nadeem Iqbal
*Attorney, Agent, or Firm*—Synnestvedt & Lechner LLP

[57] ABSTRACT

A method and apparatus are disclosed for powering-up a microprocessor in a system under debugger control. The microprocessor comprises I/O connection pins, internal logic, and a reset condition responsive to a reset signal. Additionally, the microprocessor has a boundary scan architecture, such as an IEEE 1149.1 (JTAG) compliant interface, which includes a boundary scan register (BSR) and at least one design-specific test data register. The BSR has normal and test modes. In the normal mode, the BSR operatively connects the internal logic to the I/O connection pins. In the test mode, the BSR operatively isolates the internal logic from the I/O connection pins. The method comprising first detecting when power is applied to the microprocessor. Once power is detected and while the microprocessor remains in the reset condition, the BSR is put into tile test mode to isolate the internal logic from the I/O connection pins. Next, the debugger controls the microprocessor via the data register of the JTAG interface, conducting the necessary functions pursuant to power-up. Once the power-up functions are performed and the reset signal is disasserted, the internal logic can be reconnected with the I/O connection pins by returning the BSR to its normal mode.

27 Claims, 4 Drawing Sheets

5,935,266

METHOD FOR POWERING-UP A MICROPROCESSOR UNDER DEBUGGER CONTROL

BACKGROUND OF THE INVENTION

1. Field of Invention

The invention relates generally to a power-up procedure for a microprocessor and, more specifically, to a procedure that utilizes a standard JTAG interface to enable a computer's debugger to control the microprocessor immediately upon power-up without the use of an in-circuit emulator.

2. Background

A microprocessor starts executing commands immediately upon power-up. In a production system, a boot programmable read only memory (PROM) boots-up the system in a safe, controlled manner. In a development system, however, the boot PROM is usually also under development. Consequently, it is replaced by random access memory (RAM) into which a test boot code is loaded after power-tip. Instructions are usually fetched from the RAM starting at fixed address, e.g., zero. The microprocessor has no indication of whether the instruction stream constitutes a valid program or just random bits from uninitialized RAM memory. Thus, to avoid execution of random instructions out of uninitialized RAM immediately upon power-up, the development system must ensure that the processor remains in a controlled state. In an in-circuit emulator (ICE) environment, this problem can be solved by additional hardware. However, if tests must be performed in a production device where an ICE cannot be connected, extra pins would be necessary, which might require a new production part. Therefore, a need exists for a procedure to power-up a microprocessor without requiring additional hardware and/or dedicated pins. The present invention fulfills this and other needs.

SUMMARY OF THE PRESENT INVENTION

The present invention is directed to a method and system for powering-up a microprocessor under external control without the use of an in-circuit emulator. The microprocessor comprises I/O connection pins, internal logic, and a reset condition responsive to a reset signal. Additionally, the microprocessor has a boundary scan architecture, such as an IEEE 1149.1 (JTAG) compliant interface, which includes a boundary scan register (BSR) and at least one design-specific test data register. The BSR has normal and test modes. In the normal mode, the BSR operatively connects the internal logic to the I/O connection pins. In the test mode, the BSR operatively isolates the internal logic from the I/O connection pins.

The preferred method embodiment of the present invention involves several steps. First, a determination of when power is applied to the microprocessor is made. Once power is detected and while the microprocessor remains in the reset condition, the BSR is put into the test mode to isolate the internal logic from the I/O connection pins. Next, the debugger controls the microprocessor via the data register of the JTAG interface, conducting the necessary functions pursuant to power-up. Once the power-up functions are performed and the reset signal is disasserted, the internal logic can be reconnected with the I/O connection pins by returning the BSR to its normal mode.

BRIEF DESCRIPTION OF THE DRAWINGS

The features of the present invention, which are believed to be novel, are set forth with particularity in the appended claims. The invention may best be understood by reference to the following description taken in conjunction with the accompanying drawings, wherein like reference numerals identify like elements, and wherein:

DETAILED DESCRIPTION OF THE PRESENT INVENTION

Figure 1:
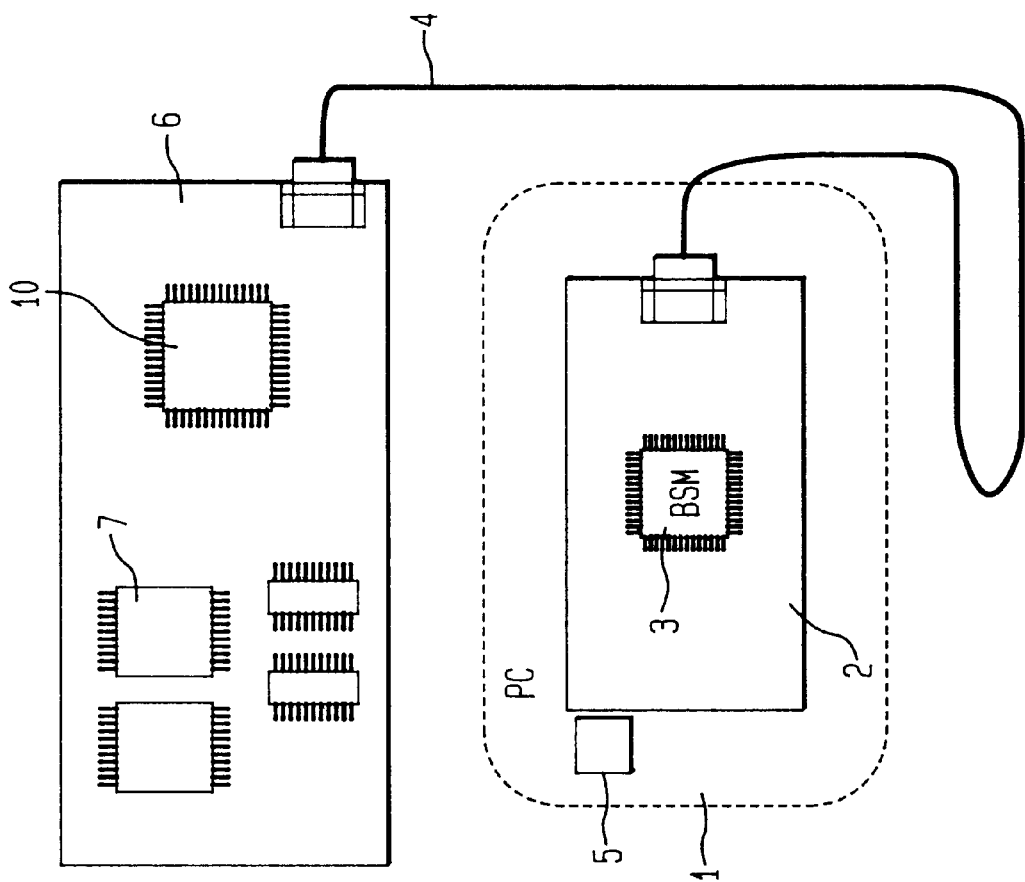
FIG. 1 shows a schematic diagram of a system under development incorporating a microprocessor.

The present invention is directed to a method of powering-up a microprocessor under debugger control without the use of an in circuit emulator. Such a method is particularly useful in development systems, a typical example of which is shown in FIG. 1. That figure depicts an external controller 1, such as a personal computer, connected to a target board 6 by a cable 4. The external controller 1 includes a debugger controller 5, and a development system controller card (DSCC) 2 with a boundary scan master (BSM) 3 responsive to the debugger controller. As used herein, the term debugger broadly refers to a controller that monitors and controls the system, which includes performing test and diagnostic functions, initialization and housekeeping tasks, and other user-specified functions. The target board 6 supports, among other components, a microprocessor 10, external logic in memory 7, and optional reset circuitry (not shown).

Figure 2:
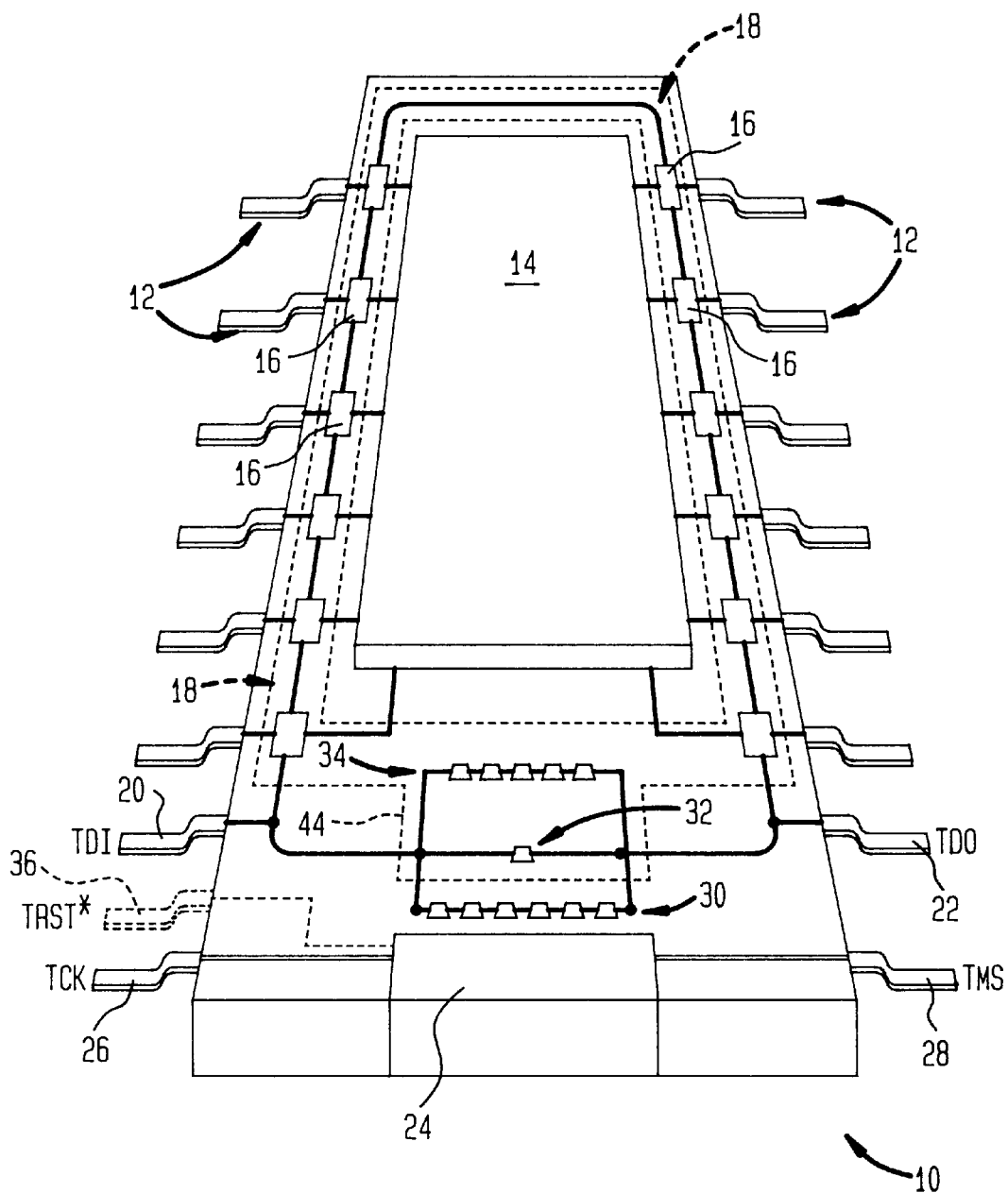
FIG. 2 shows a simplified, perspective view of an illustrative microprocessor having the JTAG interface.

Referring to FIG. 2, a perspective view of an illustrative microprocessor 10 is shown. The microprocessor 10 has a boundary scan architecture, and interconnects with other system components through input/output ("I/O") connection means, in this case, I/O pins 12. Although the present invention can be practiced using a wide variety of boundary scan configurations, it is preferred from a standardization perspective to use a boundary scan interface as described by the Institute of Electrical and Electronics Engineers (IEEE) Standard Test Access Port and Boundary Scan Architecture, IEEE Standard 1149.1—1990 promulgated in response to the industry Joint Test Action Group (JTAG)(herein "JTAG interface") which is hereby incorporated by reference.

In accordance with the IEEE standard, 4 or 5 I/O pins are dedicated to the JTAG interface for control and input and Output functions. The test clock ("TFCK") 26, test mode select ("TMS") 28, and optional test reset ("TRST") 36 inputs control a test access port ("TAP") controller 24 discussed below). Test data input ("TDI") 20 provides input to an instructional register 30 and test data registers (TDRs) 44. Output from the TDRs appears on the test data Output ("TDO") 22.

The TDRs 18 comprise a boundary scan register (BSR), a bypass register 32, and optional data registers 34. The BSR is a shift-register chain formed by interconnecting boundary scan cells 16. Every I/O pin 12 not dedicated to the JTAC interface corresponds to a single boundary scan cell ("BSC"). The BSR provides a serial path surrounding the internal logic 14. In this manner, test data may be shifted through the boundary scan path from the TDI input 20 to the TDO Output 22. The bypass register 32 provides a one bit path to effectively minimize the distance between TDI input 20 and TDO output 22. The optional device specific test registers are discussed below in relation to FIG. 3.

Figure 3:
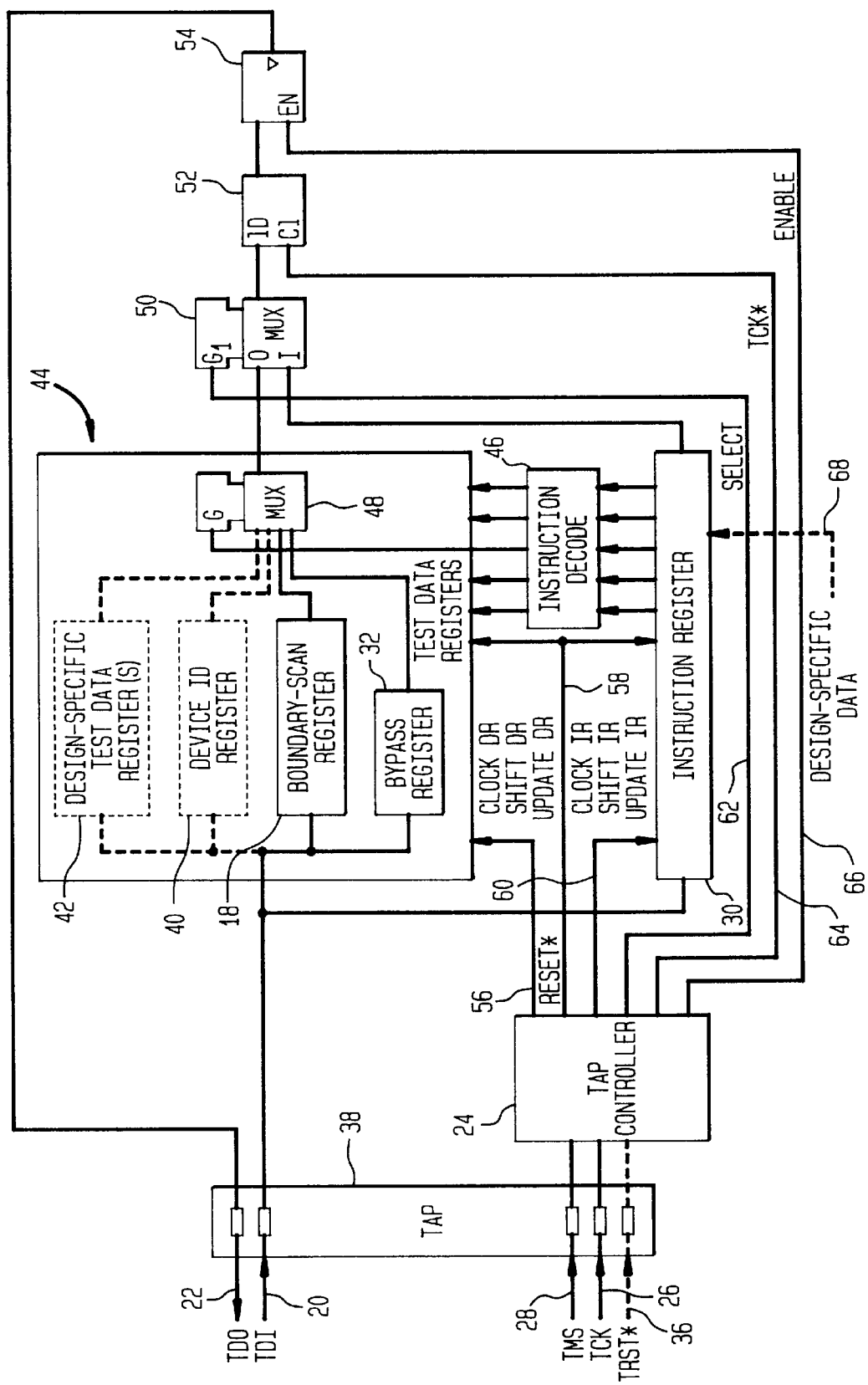
FIG. 3 shows a logic block diagram of a boundary scan device illustrating the test access port, test access port controller, instruction register and test data registers thereof.

With reference now to FIG. 3, a representative logic block diagram of a typical prior art boundary scan device is shown in more detail. Someone skilled in the art should recognize the components of this schematic and understand their functionality. Consequently, the discussion herein will be limited to only those components and functions of the JTAG interface needed to illustrate the present invention.

The overall boundary scan architecture specifies a test access port ("TAP"), the TAP controller 24, an instruction register 30, and data registers 44. The TAP 38 directs control input signals (TMS 28, TCK 26, and optional TRST 36) to the TAP controller 24, and provides serial input and output ports (TDI 20 and TDO 22) for the registers.

The functional operation of the boundary scan circuitry of microprocessor 10 is controlled by the TAP controller 24. The TAP controller 24 is a state machine which is programmable by the TMS input 28 and TCK input 26 to control the flow of data bits to the instruction register 30 as well as the test data registers 44. The optional TRST input 36 provides asynchronous initialization of the TAP controller 24 which in turn causes asynchronous initialization of other test logic included in the design. A reset signal on TRST input 36 would place the microprocessor 10 in the normal mode and render the boundary-scan register 18 inactive.

Outputs of the TAP controller 24 are supplied on data register ("DR") line 56 for providing signals such as a clock DR, a shift DR and an update DR. Similarly, TAP controller 24 supplies a clock IR, a shift IR and an update IR signal on instruction register line 60 for input to instruction register 30. When utilized in conjunction with an optional TRST input 36, the TAP controller 24 may additionally supply a reset signal on reset line 58 to test data registers 44 and instruction register ("IR") 30.

The input and Output of serial information is accomplished through the TDI and TDO pins. The TDI 20 provides serial inputs for test instructions shifted into the instruction register 30 and for data shifted through the boundary scan register 18 or other test data registers 44. The TDO output 22 is the serial output for test instructions and data from the boundary-scan register 18 or other of the test data registers 44. The contents of the selected register, whether instruction register 30 or one of the test data registers 44, are shifted out according to the signal on TCK input 26.

The JTAG interface provides for a number of registers. The instruction register 30 decodes the instruction to be performed by the test data registers 44 as well as selects the particular instruction or test data registers 44 to be accessed. Outputs from instruction register 30 are decoded through instruction decode logic 46 for input to the test data registers 44. As shown, an additional input to instruction register 30 may include design-specific data as determined by the user for input on design specific data line 68.

The test data registers 44 include the boundary scan register 18, the bypass register 32, and optional test data registers 42. In the conventional boundary scan architecture, the latter optional registers may include a device identification ("ID") register 40 as well as a design-specific test data registers 42 that can be part of the on-chip internal logic and can have both system and test functions.

An important feature of the JTAG standard with regard to the BSR is its mode. The BSR may be in either a test mode or normal mode. When in the test mode, the BSR isolates the external I/O pins 12 from the internal logic 14 (see FIG. 2). When in the normal mode, the external I/O pins are connected to the internal logic 14. The BSR mode is determined by the instruction in the JTAG instruction register 30.

The JTAG interface supports two mandatory types of instructions—test mode and normal mode. Accordingly, if a test mode JTAG instruction is entered, the BSR will enter test mode, and if a normal mode JTAG instruction is entered, the BSR will enter normal mode. An example of a test mode JTAG instruction is EXTEST (external test) which allows the BSR to be used for board level interconnect testing. The SAMPLE/PRELOAD JTAG instruction is an example of a normal mode JTAG instruction that supports two distinct functions. First, the SAMPLE JTAG instruction provides a "snap shot" of the signal flowing between the I/O pin 12 and internal logic 14 through the boundary cell. Next, the PRELOAD command shifts the data in the boundary scan cells without interfering with the signal between the pin and the internal logic.

Figure 4:
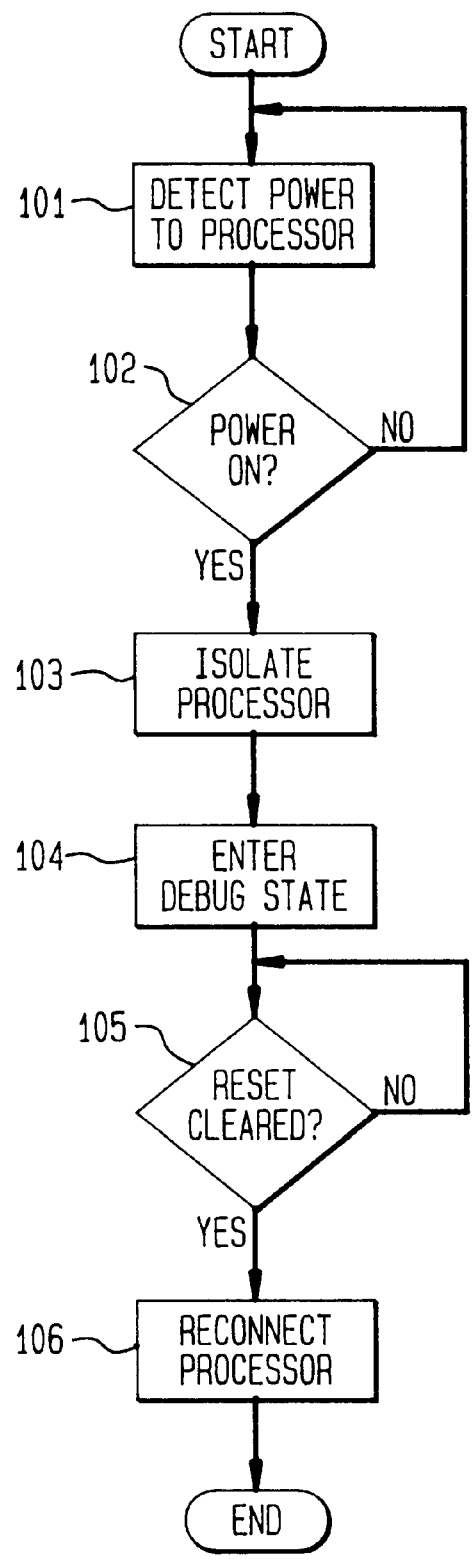
FIG. 4 shows a basic flow diagram of the power-up procedure of the present invention.

Given a system having a microprocessor with the JTAG interface, the present invention provides a procedure and system for powering-up the microprocessor under external control. In the preferred embodiment, the debugger of the external controller is used to control the microprocessor. It should be understood. however, that any suitably configured controller having instructional means for performing a method of the present invention may used. A schematic block diagram of a preferred method is depicted in FIG. 4. In Block 101, a scan of the microprocessor is performed to determine whether power is applied to it. If power is not detected in Block 102, then the scan of Block 101 is repeated. If power is detected, Block 103 isolates the microprocessor. The microprocessor enters the debug state in Block 104, wherein the debugger controls the microprocessor to power it up to a stable well defined state. Block 105 monitors the external reset to determine when it is cleared. Once cleared and after the microprocessor is stabilized, Block 106 reconnects the microprocessor to the external logic. These steps will now be considered in more detail and in regard to alternative embodiments.

1. Detecting Power to the Microprocessor (Block 101)

The first step in powering-up the microprocessor is determining when the power is applied to it using power detection means. Although the power detection means may comprise timing circuits, monitoring circuits, or other combinations of circuits, the preferred embodiment relies on the JTAG interface for detection purposes. If the JTAG interface is used, then the external controller must be activated prior to applying power to the microprocessor. In one embodiment, the debugger instructs the BSM to conduct repeated device identification register scans of the microprocessor. Since the BSM enforces a logic 1 level on the scan chain when the microprocessor lacks power, as long as a logic 1 level is detected by the debugger, it can be concluded that no power has been applied to the microprocessor. Conversely, when valid identification values are received by the BSM, it can be concluded that power has been applied to the microprocessor.

2. Isolating the Microprocessor (Block 103)

Immediately upon power-up, the internal logic of the microprocessor must be isolated to avoid execution of random instructions from uninitialized RAM. To this end, the system places the BSR in the test mode using isolation means. Once in test mode, the BSR isolates the internal logic from the I/O pins as discussed above. The preferred isolation means comprises the debugger configured to send a test mode JTAG instruction to the microprocessor. For example, the debugger can instruct the BSM to load the EXTEST JTAG instruction into the JTAG instruction register. Being a test mode JTAG instruction, it transforms BSR into a barrier between the internal logic and the I/O pins.

It is preferred that steps one and two be executed while the microprocessor remains in a reset condition. This requires that the JTAG interface power-up quickly relative to the normal logic power-up reset. For devices with on-chip power-up reset circuits, this implies that the JTAG logic power-up reset must be shorter in duration than the power-up reset of the internal logic. Likewise, if a device has an external JTAG reset (TRST*) and/or an external reset for normal operation circuits, the duration of the reset applied to the TRST* signal must be shorter than that applied to normal reset signal. In practice, this condition is not difficult to achieve. The typical duration of the external reset signal asserted by an external power up reset circuit is approximately 50 ms with some implementations extending this to several hundred milliseconds. On the other hand, the typical duration of an internal JTAG interface power-up reset is about a few milliseconds. If the microprocessor is interconnected among other system components that may be affected adversely by the microprocessor's instability during power-up, it is preferred that the I/O pins be initialized to maintain the interconnected system components in a controlled state, e.g., in a reset condition or a deactivated state. In one embodiment, the debugger initializes the I/O pins by instructing the BSM to load the SAMPLE/PRELOAD JTAG instruction into the instructional register while the system remains in a reset condition. This JTAG instruction allows pin values to be scanned into the BSR. Next, the BSM preloads the BSR with a suitable vector while the system remains in a reset condition. The suitable vector has pin values that effect a reset condition in the rest of the system or otherwise deactivate the control signals from the microprocessor to the interconnected system components. Therefore, by controlling the external I/O pins with the boundary scan register, the rest of the target system remains in a deactivated state, even after the power-tip reset signal is disasserted.

3. Placing Microprocessor in Debug State (Block 104)

Once isolated, the microprocessor is then placed in a debug state to enable the debugger or other controller to control it via the JTAG interface. The microprocessor can be placed in the debug state using switching means. Although the switching means can comprise known switching circuitry, the preferred means involves means for setting a particular bit in a test data register to a certain value. This effectively switches the microprocessor from an operational state to the debug state.

When the microprocessor is in the debug state, it fetches instructions from a specific source, e.g., a debug monitor. It does not receive instructions from external memory via the I/O pins as it would in the operational state. Additionally, in the debug state, the microprocessor executes self-check or other functions pursuant to power-up or debugging. It does not execute application commands as it would in the operational state.

In the preferred embodiment, the microprocessor executes commands from a debug monitor when in the debug state. The debug monitor typically includes instructions for reading memory, uploading data to the debugger, receiving data from the debugger, writing to memory, reading and writing to internal registers of the microprocessors, and leaving the debug state.

The debug monitor can be resident in an on-chip ROM/PROM or it could be external to the chip and the commands delivered to the microprocessor via a data register of the JTAG interface. In the preferred embodiment, the debug monitor is resident in an on-chip ROM and contains command loops. The microprocessor executes a particular command loop according to a particular JTAG instruction it receives from the debugger or other controller via a design-specific test data register. It is preferred that the design-specific test data registers be part of the on-chip internal logic so that it has both system and test functions. In a preferred embodiment, the debug monitor also continuously commands the microprocessor to scan its data registers for JTAG instructions. Once a command is received, the microprocessor fetches and executes the appropriate algorithm or command loop from the debug monitor. This configuration enables the debugger or other controller to send a simple JTAG instruction for the microprocessor to execute a particular algorithm or command loop found in the debug monitor. In this manner, the debug monitor drives the microprocessor according to the debugger's JTAG instructions.

Before the microprocessor is stabilized, the debugger or other controller must be capable of communicating with the microprocessor while the BSR remains in test mode. This ensures that the microprocessor remains isolated and cannot execute or send errant signals. To this end, during power-up, the debugger must communicate with the microprocessor using only test mode JTAG instructions.

4. Determining When Reset Is Cleared (Block 105)

In systems having an externally generated reset signal, the signal must be cleared before reconnecting the internal logic to the I/O pins. Otherwise, the microprocessor will not remain in the debug state when the BSR returns to normal mode. Determining whether the reset signal is cleared is performed rising monitoring means. Although the monitoring means may comprise timing circuits, monitoring circuits, or combinations of other circuits, it preferably involves the JTAG interface. More specifically, the EXTEST JTAG instruction can be used to enable the BSR to test the I/O pins and therefore determine if the reset signal is present or not.

It should be noted that if an internal reset is used, the reset condition must expire before the microprocessor can enter the debug state. In such a case, it is preferred that the BSR, while in the test mode and before the reset condition expires, be preloaded with values that are benign to the microprocessor's operation. While in the reset condition, the test data register that controls the microprocessor's debug state can be set such that when the reset condition elapses the microprocessor enters the debug state. Therefore, with chips having an internal reset, once in the debug state, there is no need to determine whether the reset signal is cleared before reconnecting the internal logic to the I/O pins since the reset condition must have expired for the chip to enter the debug state.

5. Reconnecting the Microprocessor to the External Logic (Block 106)

After the reset signal is determined to be cleared, the internal logic can be reconnected to the I/O pins using reconnecting means. The preferred embodiment of the reconnection means is the debugger configured to send a normal mode JTAG instruction. The SAMPLE/PRELOAD JTAG instruction is an example of a suitable normal mode JTAG instruction.

Although the internal logic is now connected to the I/O pins, the microprocessor remains in a debug state. This state may be desirable to debug application code or other system functions. Eventually, after the debug functions have been completed and external logic has been initialized, the debugger instructs the microprocessor to leave the debug state using an algorithm in the debug monitor.

Therefore, in accordance with the present invention, a microprocessor can be controlled through its boundary scan interface to perform a wide range of functions including power-up tasks, boot code debugging operations, and other functions where controlling the microprocessor in an isolated condition is desirable.

Obviously, numerous modifications and variations of the present invention are possible in the light of the above teachings. It is therefore understood that within the scope of the appended claims, the invention may be practiced otherwise than as specifically described herein.

What is claimed is:

1. A method of powering-up a microprocessor in a system having an external controller, said microprocessor comprising I/O connection means, internal logic, a reset condition occurring when power is applied to said microprocessor, and a boundary scan interface including a boundary scan register (BSR), and at least one design-specific test data register, said BSR having normal and test modes, said BSR operatively connecting said internal logic to said I/O connection means in said normal mode, said BSR operatively isolating said internal logic from said I/O connection meams in said test mode, said method comprising:

detecting when power is applied to said microprocessor;
   isolating said internal logic from said I/O connection means by placing said BSR in said test mode while said microprocessor is in said reset condition after having power applied to it; and
   controlling said microprocessor with said external controller via said design-specific test data register while said BSR remains in said test mode.

2. The method of claim 1, wherein said boundary scan interface complies with IEEE 1149.1 standard (JTAG interface).

3. A method of powering-up a microprocessor in a system having an external controller with a debugger, said microprocessor comprising I/O connection means, internal logic, a logic reset condition occurring when power is applied to said microprocessor, a debug state, and a boundary scan interface including a boundary scan register (BSR), and at least one design-specific test data register, said BSR having normal and test modes, said BSR operatively connecting said internal logic to said I/O connection means in said normal mode, said BSR operatively isolating said internal logic from said I/O connection means in said test mode, said method comprising:

detecting when power is applied to said microprocessor;
   isolating said internal logic from said I/O connection means by placing said BSR in said test mode while said microprocessor remains in said reset condition after having power applied to it;
   setting said microprocessor to a debug state while said BSR remains in said test mode, said debugger being capable of instructing said microprocessor via said design-specific test data register to execute certain commands while said microprocessor is in said debug state.

4. The method of claim 3, wherein said boundary scan interface complies with IEEE 1149.1 standard (JTAG interface).

5. The method of claim 4, said method further comprising: reconnecting said internal logic with said I/O connection means by returning said BSR to said normal mode.

6. The method of claim 5, wherein said reset condition is imposed by a reset signal, said method further comprising:

determining if said reset signal is cleared before reconnecting said internal logic with said I/O connection means.

7. The method of claim 6, wherein said reset signal is determined to be cleared by using said EXTEST JTAG instruction, said EXTEST JTAG instruction enabling said BSR to test said RESET signal.

8. An external controller for controlling the power-up of a microprocessor, wherein said microprocessor is interconnected to at least on e system component, said microprocessor comprising I/O connection means, internal logic having a reset condition occurring when the power is applied to said microprocessor and a JTAG boundary scan interface including a boundary scan register (BSR) and a least one design-specific test data register, said BSR having normal and test modes, said BSR operatively connecting said internal logic to said I/O connection means in said normal mode, said BSR operatively isolating said internal logic from said I/O connection means in said test mode, said external controller comprising:

means for detecting when power is applied to said microprocessor;
   means for isolating said internal logic from said I/O connection means by placing said BSR in said test mode while said microprocessor is in said reset condition after having power applied to it, wherein said means for isolating said microprocessor further comprises:
      means for initializing said I/O connection means to deactivate said microprocessor relative to said system component;
   means for setting said microprocessor to a debug state while said BSR is in said test mode;
   means for instructing said microprocessor via said design-specific data register to execute certain commands while said microprocessor remains in said debug state;
   means for reconnecting said internal logic with said I/O connection means by returning said BSR to said normal mode.

9. The method of claim 5, wherein said microprocessor is connected to at least one system component, and wherein isolating said microprocessor further comprises initializing said I/O connection means to deactivate said microprocessor relative to said system component.

10. The method of claim 9, wherein initializing said I/O connection means involves:

preloading said BSR with suitable pin values, said suitable pin values effecting a reset condition on said system component.

11. The method of claim 5, wherein setting said microprocessor to said debug state involves writing a particular value in a test data register of said microprocessor.

12. The method of claim 5, wherein said microprocessor executes said certain commands from a debug monitor when in said debug state.

13. The method of claim 12, wherein said debug monitor is resident in on-chip ROM.

14. The method of claim 12, wherein certain commands are sent by said debugger via said data register.

15. The method of claim 5, wherein reconnecting said internal logic from said I/O connection means includes loading a normal mode JTAG instruction into said instruction register.

16. The method of claim 15, wherein said normal mode JTAG instruction is SAMPLE/PRELOAD.

17. An external controller for controlling the power-up of a microprocessor, said microprocessor comprising I/O connection means, internal logic, a reset condition occurring when power is applied to said microprocessor, a debug state, and a boundary scan interface including a boundary scan register (BSR) and at least one design-specific test data register, said BSR having normal and test modes, said BSR operatively connecting said internal logic to said I/O connection means in said normal mode, said BSR operatively isolating said internal logic from said I/O connection means in said test mode, said external controller comprising:

means for detecting when power is applied to said microprocessor;

means for isolating said internal logic from said I/O connection means by placing said BSR in said test mode while said microprocessor is in said reset condition after having power applied to it;

means for setting said microprocessor to a debug state while said BSR is in said test mode;

means for instructing said microprocessor via said design-specific data register to execute certain commands while said microprocessor remains in said debug state; and means for reconnecting said internal logic with said I/O connection means by returning said BSR to said normal mode.

18. The external controller of claim 17, wherein said boundary scan interface complies with IEEE 1149.1 (JTAG interface).

19. The external controller of claim 18, wherein said system includes a boundary scan master (BSM) operatively connected to said JTAG interface and responsive to said debugger, said JTAG interface includes a device identification (ID) register, and wherein said means for detecting when said power is applied comprises:

means for instructing said JTAG interface to conduct an ID register scan of said microprocessor, said debugger detecting power to said microprocessor when said BSM receives valid device identification values.

20. A debugger control for controlling the power-up of a microprocessor in a system, said microprocessor comprising I/O connection means, internal logic, a reset condition occurring when power is applied to said microprocessor, a debug state, and a boundary scan interface including a boundary scan register (BSR) and at least one design-specific test data register, said BSR having normal and test modes, said BSR operatively connecting said internal logic to said I/O connection means in said normal mode, said BSR operatively isolating said internal logic from said I/O connection means in said test mode, said debugger control comprising instructional means for:

detecting if power is applied to said microprocessor;

isolating said internal logic from said I/O connection means by placing said BSR in said test mode while said microprocessor is in said reset condition;

setting said microprocessor to a debug state;

delivering instructions to said microprocessor via said design-specific data register to execute certain commands while said microprocessor remains in said debug state; and reconnecting said internal logic with said I/O connection means by returning said BSR to said normal mode.

21. The debugger control of claim 20, wherein said boundary scan interface complies with IEEE 1149.1 (JTAG interface).

22. The debugger control of claim 21, wherein said system includes a boundary scan master (BSM) operatively connected to said JTAG interface and responsive to said debugger, said JTAG interface includes a device identification (ID) register, and wherein said instruction means for detecting when said power is applied comprises:

instructional means for conducting an ID register scan of said microprocessor using said JTAG interface, said power being detected when BSM receives valid device identification values.

23. In a microprocessor having I/O connection means, internal logic and an IEEE 1149.1 (JTAG) complaint interface including a boundary scan register (BSR), said BSR having normal and test modes, said BSR operatively connecting said internal logic to said I/O connection means in said normal mode, said BSR operatively isolating said internal logic from said I/O connection means in said test mode, the improvement comprising:

at least one design-specific test data register adapted to receive JTAG instructions from an external controller;

on-chip ROM containing a debug monitor;

at least a debug state wherein said internal logic fetches instructions from a debug monitor and executes commands in said debug monitor in response to at least one test mode JTAG instruction received in said design-specific test data register; and means for switching said internal logic said debug state.

24. A method of powering-up a microprocessor in a system having an external controller with a debugger, said microprocessor comprising I/O connection means, internal logic having a logic reset condition occurring when power is applied to said microprocessor, and a JTAG boundary scan interface including a boundary scan register (BSR) and at least one design-specific test data register, said BSR having normal and test modes, said BSR operatively connecting said internal logic to said I/O connection means in said normal mode, said BSR operatively isolating said internal logic from said I/O connection means in said test mode, said method comprising:

detecting when power is applied to said microprocessor;

isolating said internal logic from said I/O connection means by placing said BSR in said test mode while said microprocessor remains in said reset condition after having power applied to it;

setting said microprocessor to a debug state while said BSR remains in said test mode, said debugger being capable of instructing said microprocessor via said design-specific test data register to execute certain commands while said microprocessor is in said debug state;

reconnecting said internal logic with said I/O connection means by returning said BSR to said normal mode;

wherein said system includes a boundary scan master (BSM) operatively connected to said JTAG interface and responsive to said debugger, said JTAG interface includes a device identification (ID) register; and wherein detecting when said power is applied comprises:
      activating said debugger prior to applying power to said microprocessor, said debugger instructing said JTAG interface to conduct an ID register scan of said microprocessor, said debugger detecting power to said microprocessor when BSM receives valid device identification values.

25. A method of powering-up a microprocessor in a system having an external controller with a debugger, said microprocessor comprising I/O connection means, internal logic having a logic reset condition occurring when power is applied to said microprocessor and a JTAG boundary scan interface including a boundary scan register (BSR), at least one design-specific test data register, said BSR having normal and test modes, said BSR operatively connecting said internal logic to said I/O connection means in said normal mode, said BSR operatively isolating said internal logic from said I/O connection means in said test mode, said method comprising:

detecting when power is applied to said microprocessor;

isolating said internal logic from said I/O connection means by placing said BSR in said test mode while said microprocessor remains in said reset condition after having power applied to it, wherein isolating said internal logic from said I/O connection means includes loading a test mode JTAG instruction into said instruction register;

setting said microprocessor to a debug state while said BSR remains in said test mode, said debugger being capable of instructing said microprocessor via said design-specific test data register to execute certain commands while said microprocessor is in said debug state; and reconnecting said internal logic with said I/O connection means by returning said BSR to said normal mode.

26. The method of claim 25, wherein said test mode JTAG instruction is EXTEST.

27. A debugger control for controlling the power-up of a microprocessor in a system, wherein said microprocessor is interconnected to at least one system component, said microprocessor comprising I/O connection means, internal logic having a reset condition occurring when power is applied to said microprocessor and a JTAG boundary scan interface including a boundary scan register (BSR) and at least one design-specific test data register, said BSR having normal and test modes, said BSR operatively connecting said internal logic to said I/O connection means in said normal mode, said BSR operatively isolating said internal logic from said I/O connection means in said test mode, said debugger control comprising instructional means for:

detecting if power is applied to said microprocessor;

isolating said internal logic from said I/O connection means by placing said BSR in said test mode while said microprocessor is in said reset condition, wherein said instructional means for isolating said microprocessor further comprises:
    instructional means for initializing said I/O connection means to deactivate said microprocessor relative to said system component;

setting said microprocessor to a debug state;

delivering JTAG instructions to said microprocessor via said design-specific data register to execute certain commands while said microprocessor remains in said debug state; and reconnecting said internal logic with said I/O connection means by returning said BSR to said normal mode.

* * * * *